United States Patent
Sato

(10) Patent No.: US 7,271,014 B2
(45) Date of Patent: Sep. 18, 2007

(54) FABRICATION METHOD OF SEMICONDUCTOR INTEGRATED CIRCUIT DEVICE INCLUDING INSPECTING USING PROBE CARD

(75) Inventor: Tadafumi Sato, Chitose (JP)

(73) Assignee: Renesas Technology Corp., Tokyo (JP)

( * ) Notice: Subject to any disclaimer, the term of this patent is extended or adjusted under 35 U.S.C. 154(b) by 330 days.

(21) Appl. No.: 11/016,925

(22) Filed: Dec. 21, 2004

(65) Prior Publication Data
US 2005/0142697 A1 Jun. 30, 2005

(30) Foreign Application Priority Data
Dec. 24, 2003 (JP) .............................. 2003-426137

(51) Int. Cl.
*H01L 21/66* (2006.01)
*H01L 21/00* (2006.01)
(52) U.S. Cl. .................... 438/14; 438/48; 257/E21.001
(58) Field of Classification Search .................. 438/14, 438/48
See application file for complete search history.

(56) References Cited

U.S. PATENT DOCUMENTS

| 6,337,577 | B1 * | 1/2002 | Doherty et al. | 324/765 |
| 2002/0043970 | A1 * | 4/2002 | Lee | 324/158.1 |
| 2003/0098701 | A1 * | 5/2003 | Tatematsu et al. | 324/754 |

FOREIGN PATENT DOCUMENTS

JP 11-044709 2/1999

* cited by examiner

*Primary Examiner*—Thanh Nguyen
(74) *Attorney, Agent, or Firm*—Antonelli, Terry, Stout & Kraus, LLP.

(57) ABSTRACT

A probe card is formed of a main board and a sub-board located above the principal surface of the main board. The sub-board is located inside of an internal circumferential pad region of the main board. Relays are arranged in a line along the external circumference of the upper surface of the sub-board. Electrical components, such as the relays, a capacitor, a crystal-controlled oscillator, and an IC, are selected from components which are reduced in size as much as possible. The circuit for inspection is formed of the electrical components provided over the sub-board and the wiring layers within the sub-board. As a result, the yield of the probe card can be improved.

9 Claims, 13 Drawing Sheets

FIG. 18

| | DIFFERENCE IN YIELD |
|---|---|
| CONDITION A (NUMBER OF SAMPLES: 2494 WAFERS) | 1.48% |
| CONDITION B (NUMBER OF SAMPLES: 2347 WAFERS) | 2.69% |

FIG. 19

| | GENERATION RATE |
|---|---|
| CONDITION A (NUMBER OF SAMPLES: 2494 WAFERS) | 0.48% |
| CONDITION B (NUMBER OF SAMPLES: 2347 WAFERS) | 0.73% |

FIG. 20

|  | AVERAGE YIELD |
|---|---|
| CONDITION A (NUMBER OF SAMPLES: 1654 WAFERS) | 94.11% |
| CONDITION B (NUMBER OF SAMPLES: 3281 WAFERS) | 91.98% |

FIG. 21

|  | AVERAGE YIELD |
|---|---|
| CONDITION A (NUMBER OF SAMPLES: 4768 WAFERS) | 93.77% |
| CONDITION B (NUMBER OF SAMPLES: 4103 WAFERS) | 91.26% |

PROBE CARD OPERATING DIRECTION

PROBE CARD OPERATING DIRECTION

PROBE CARD OPERATING DIRECTION

PROBE CARD OPERATING DIRECTION

FABRICATION METHOD OF SEMICONDUCTOR INTEGRATED CIRCUIT DEVICE INCLUDING INSPECTING USING PROBE CARD

CROSS-REFERENCE TO RELATED APPLICATION

The present application claims priority from Japanese patent application No. 2003-426137, filed on Dec. 24, 2003, the content of which is hereby incorporated by reference into this application.

BACKGROUND OF THE INVENTION

The present invention relates in general to a method of fabrication of a semiconductor integrated circuit device, and more particularly, the invention relates to a technology which may be effectively applied to an inspection process for inspecting an integrated circuit formed on a semiconductor wafer by utilizing a semiconductor inspection apparatus including a probe card.

A technology (refer to the Patent Document 1), has been proposed for providing, for example, a probe card, which is formed of a multilayer wiring board, in which high-speed operation signals and minute signals can be measured accurately without any influence from noise. This is achieved by arranging a connecting means to be connected to a tester head in a connecting region of the external circumferential portion to make it possible to form, in the component mounting region in the internal circumferential portion, an electronic circuit for measuring the characteristic of a semiconductor device formed within a semiconductor wafer, which serves as the inspection object, by providing a shield pattern in a signal pattern for electrically connecting to the probe from the connecting region so as to surround this signal pattern, by providing a shield member to the connecting pins inserted to the connecting means, and by connecting such shield member to the shield pattern.

[Patent Document 1]
Japanese Unexamined Patent Publication No. Hei 11(1999)-44709

SUMMARY OF THE INVENTION

In recent years, diversified functions and high-speed operations have been required for a semiconductor integrated circuit device, and, therefore, a pad to be arranged over the principal surface of a semiconductor chip (hereinafter referred to only as a chip) is required in many cases to provide many connecting pins. Accordingly, a probe card for inspecting the semiconductor chip to determine good/no-good conditions of the semiconductor chip in the wafer condition (hereinafter referred to as a probe inspection) has also experienced an increase in the number of electronic components and wires (circuits) to be mounted therein. The inventors of the present invention have been engaged in development of such a probe card, and they have also detected the following problems in the course of this development work.

Namely, in the probe card described above, an increase in the number of electronic components and wires has brought about a need for a closer integration of the electronic components and wires. Therefore, it has become difficult to determine when a disconnection of wires has occurred during fabrication of the probe card, with the result that such disconnection is detected for the first time during the operation check of the probe card. As a result, a problem arises in that the probe cards which can be delivered to customers through a single operation check have been reduced in number.

Moreover, for the probe card described above, the region available to mount electronic components and wires is limited. An undesirable influence from noise resulting from crosstalk and reflection appears, and so it becomes difficult to accurately measure the test signal when mounting more electronic components and wires within a limited region.

In addition, with an increase in the number of electronic components and wires mounted over the probe card, these components and wires are integrated more closely. Therefore, it becomes difficult in some cases to accomplish a repair through re-connection of wires and replacement of electronic components, for example, when the electronic components and wires are separated from the probe card due to oxidation of the soldered portions, when wires are disconnected, and when a problem is generated in the electronic components.

Moreover, with an increase in the number of electronic components and wires mounted on the probe card, the electronic components and wires are not only integrated closely, but they are also stacked in the upper direction. Meanwhile, in the prober in which a probe card is mounted, the area of the region available for the mounting of the probe card is limited. Since the electronic components and wires are stacked in many layers in the upper direction over the probe card, a problem rises here, in which the probe card cannot be mounted automatically in the prober, including a small region prepared for mounting of the probe card. Moreover, since the area of the region provided for mounting of the probe card is limited, it becomes difficult to increase the number of electronic components and wires to be mounted over the probe card.

Moreover, with diversification of the functions of a semiconductor integrated circuit device, the number of signal terminals increases, so that the circuit used for inspection is more complicated in the probe card. Since the circuit used for inspection is more complicated, the number of electronic components and wires to be mounted over the probe card is further increased, and they are integrated more closely. However, since the region provided for arrangement of electronic components and wires within the probe card is restricted, it becomes difficult to provide a certain means to satisfy the requirement for an increase in the number of signal terminals.

Moreover, with an increase in the number of circuits (electronic components and wires) mounted over the probe card, the temperature of the components, such as a relay included in the circuits, rises, resulting in the problem that a defective operation may be generated in the relay.

For the reason described above, the probe card investigated by the inventors of the present invention includes a problem in that the yield thereof is lowered.

It is therefore an object of the present invention to provide a technology for improving the yield of a probe card.

The aforementioned and the other objects and novel features of the present invention will become more apparent from the following description and the accompanying drawings thereof.

The typical features and aspects of the invention disclosed in the present specification will be briefly described below.

A method of fabrication of a semiconductor integrated circuit device in accordance with the present invention comprises the steps of:

(a) preparing a semiconductor wafer having a region which is segmented into a plurality of chip regions, a semiconductor integrated circuit being formed in each region of a plurality of chip regions, and wherein a plurality of first electrodes for electrical connection with the semiconductor integrated circuit are formed over the principal surface;

(b) preparing for a probe card including a first board having a plurality of contact terminals for contact with a plurality of first electrodes, a second board mounted on the first board and provided with a plurality of wiring layers for electrical connections with a plurality of contact terminals, and a plurality of electronic components mounted over the principal surface of the second board to form a first circuit for electrical connection with a tester, wherein the first board and the second board are electrically connected through a first wire; and (c) conducting electrical inspection of the semiconductor integrated circuit through contact of the end portions of the plurality of contact terminals with a plurality of first electrodes.

The effect obtained from the typical features of the invention disclosed in the present patent application will be briefly described as follows. That is, the yield of a probe card can be improved.

BRIEF DESCRIPTION OF THE DRAWINGS

FIG. 18 is a diagram illustrating the difference in yields of the second probe inspection and the third probe inspection when the probe inspection, has been conducted for three times the same wafer.

FIG. 19 is a diagram illustrating the generation rate of chip regions determined as having a fault due to noise generated in the wires provided in the probe card, when the probe inspection has been implemented for a sheet of wafer.

FIG. 20 is a diagram illustrating the result when the probe inspection has been implemented for a plurality of wafers.

FIG. 21 is a diagram illustrating the result when the probe inspection has been implemented for a plurality of wafers.

DETAILED DESCRIPTION OF THE PREFERRED EMBODIMENT

Figure 1:
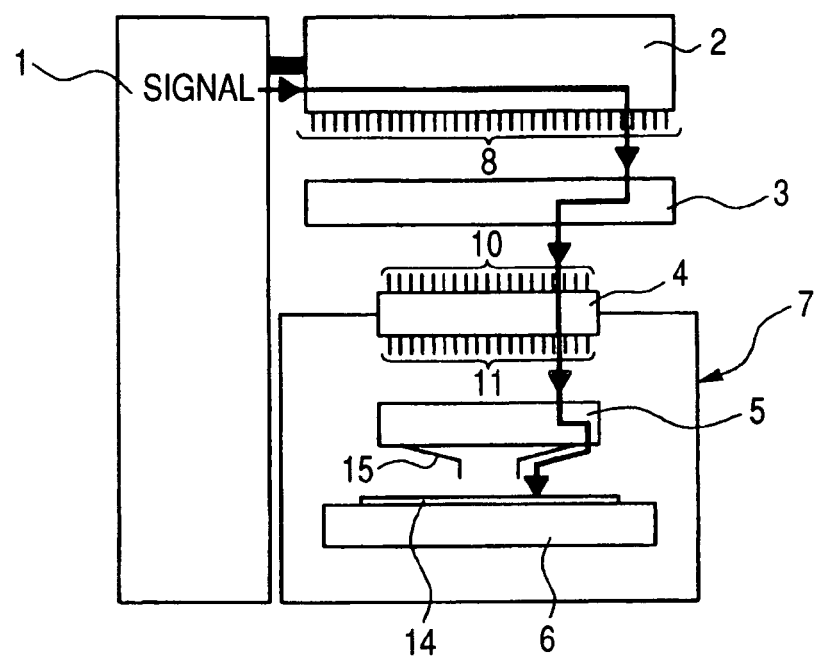
FIG. 1 is a block diagram illustrating the structures of a tester and a jig used in the probe inspection process as part of the fabrication of a semiconductor integrated circuit device representing an embodiment of the present invention.

Prior to the detailed description of the present invention, the meaning of technical terms used in the present application will be described.

Wafer means a single silicon substrate (in general, almost a flat disk type), an SOI (Silicon On Insulator) substrate, a sapphire substrate, a glass substrate, the other insulator, non-insulator or semiconductor substrate or the like, or a composite substrate of these substrates. Moreover, a semiconductor integrated circuit device as referred to in the present application includes not only those formed over a semiconductor or insulator substrate, such as silicon wafer and sapphire substrate or the like, but also those, except for the case designated clearly, formed over a TFT (Thin Film Transistor) and the another insulator substrate, such as one formed of glass like an STN (Super-Twisted-Nematic) liquid crystal.

Device surface means the principal surface of a wafer and also means the surface over which a device pattern corresponding to a plurality of chip regions is formed by a lithography process.

Probe stylus, or only stylus, means an object including an end point which is traditionally formed like a probe stylus, and a contact terminal including the end point formed narrower like a stylus, a contact terminal including a pyramidal end point, and a bump electrode formed in another shape.

Probe inspection means an electrical test to be conducted using a prober applied to a wafer, which has completed its wafer process, in which an electrical inspection of semiconductor integrated circuits is performed by applying the end point of the probe stylus to the electrodes formed on the principal surface of a chip region. This probe inspection is performed for determining good/no-good products by implementing a function test to check whether the device operates to complete the predetermined functions, and which also tests for a DC operation characteristic and an AC operation characteristic. This probe inspection is discriminated from the selection test (final test) which is conducted after segmentation of the wafer into respective chip (or after completion of the packaging).

Tester (test system) means a device for conducting electrical inspection of a semiconductor integrated circuit by generating signals, such as a predetermined voltage and standard timing signals.

Test head means a device which is electrically connected to the tester to receive voltages and signals transmitted from the tester, to apply the signals, such as voltages and detail timing signals, to the semiconductor integrated circuit, and to send such signals to a performance board to be described later via a pogo-pin.

Performance board means a board which is electrically connected to the test head via a pogo-pin to send voltages and signals transmitted from the test head to a contact ring, to be described later. Moreover, the performance board is provided, in some cases, with an OSC circuit, a X'tal circuit, a bypass circuit, and a AD/DA circuit, to be described later, in order to generate signals which cannot be generated by the tester and to send such signals to the contact ring.

OSC (Oscillator System Clock) circuit means the system clock generating circuit for generating the reference clock used to operate a CPU (Central Processing Unit) and peripheral functions. When the system clock is inputted to the device, this system clock is divided in frequency within the device using a counter of several tens of bits. The frequency-divided clocks are used as the internal clocks of the built-in peripheral module.

X'tal circuit means a clock generating circuit of a timer used mainly for the clock. When a timer clock for the clock (for example, 32.768 kHz and 38.4 kHz) is inputted to the device, the clock is divided in the device using a counter of several bits, and the divided clocks are used as clocks for the time base operation for the clock of the timer.

Bypass circuit means a circuit for eliminating power supply noise. This circuit eliminates high frequency noise and low frequency noise using an electrolytic capacitor and a ceramic capacitor.

AD/DA circuit means a circuit for converting an analog signal to a digital signal and also converting a digital signal to an analog signal.

Contact ring means a device which is electrically connected with the performance board and a probe card, to be described later, via a pogo-pin in order to send the signals transmitted from the performance board to the probe card.

Probe card means a structure which is electrically connected to the contract ring via a pogo-pin and includes the probe stylus to be in contact with a wafer serving as the inspection object and a multilayer circuit board. This structure sends the signals sent from the contract ring to the object wafer. Moreover, in some cases, this structure is provided with the OSC circuit, X'tal circuit, bypass circuit and AD/DA circuit, etc. to generate signals which cannot be generated by the tester and also sends these signals to the wafer which serves as the inspection object.

Prober means an inspection device comprising the contact ring, probe card, and a sample supporting system which includes a wafer stage on which the wafer is placed.

The invention will be separately described in units of a plurality of sections or profiles when it is required. However, unless otherwise described clearly, these units are related with each other. Namely, one is in the relation of a part or the entire part of all examples of modifications, details, and supplementary descriptions of the other.

Moreover, when a description refers to a number of elements (including pieces, numerical values, quantity, and range or the like) in the following description of the embodiment, such a number of elements is never limited to the particular number unless otherwise described clearly and obviously limited only to the particular number. Namely, such number may be larger or smaller than the particular number.

In addition, in the following description, the structural elements (including element steps or the like) are not always essential, unless otherwise described clearly and considered as essential in principle.

Similarly, when shapes of structural elements and positional relationships are described in the following embodiment, those substantially approximated to or resembling such shapes or the like should be included unless otherwise clearly described differently and clearly considered to be different in principle. This is also true of above numerical values and ranges.

In addition, elements having like functions are designated with the same reference numerals throughout the drawings, and repeated descriptions thereof are omitted.

Moreover, the drawing may be sometimes hatched partially to make observation of the elements in the drawing easier even in the case of a plan view.

The preferred embodiment of the present invention will be described in detail with reference to the accompanying drawings.

Figure 2:
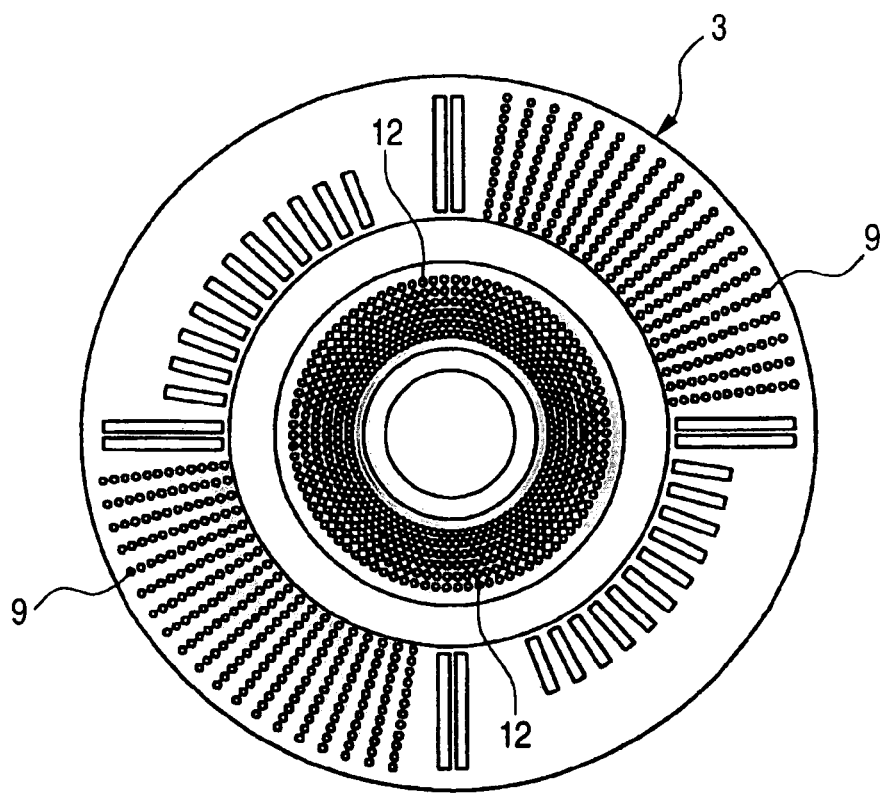
FIG. 2 is a plan view of the performance board illustrated in FIG. 1.

FIG. 1 is an a illustrating the structure of a tester and a jig that is used in the probe inspection process according to an embodiment of the present invention, along with the flow of test signals. Moreover, FIG. 2 is a plan view of a performance board included in the jig. As illustrated in FIG. 1, this jig is formed of a test head 2, a performance board 3, a contact ring 4, a probe card 5, and a wafer stage 6. A part of the contact ring 4, along with the probe card 5 and the wafer stage 6, are accommodated within a prober 7.

The test head 2 is electrically connected with the tester 1. Moreover, the test head 2 is provided with a plurality of pogo-pins 8 for electrical connection with the circuit provided therein, with the end points thereof extending toward the performance board 3. Since the end portions of these pogo-pins 8 are connected to a connect pad 9 provided in the performance board 3, the test head 2 and the performance board 3 are connected electrically.

The contact ring 4 is provided with a plurality of pogo-pins 10 and a plurality of pogo-pins 11 for electrical connection with the circuits provided therein. Moreover, the end points of the pogo-pins 10 are directed toward the performance board 3, while the end points of the pogo-pins 11 are directed toward the probe card 5 within the prober 7. The contact ring 4 and performance board 3 can be connected electrically by connecting the end points of the plurality of pogo-pins 10 to a connect pad 12, which is provided in the internal portion relative to the connect pad 9 within the performance board 3. Moreover, the contact ring 4 and probe card 5 can be connected electrically by connecting the end points of the plurality of pogo-pins 11 to the connect pad provided in the probe card 5. In addition, the connect pad 12 is electrically connected to the connect pad 9 via a circuit formed within the performance board 3.

The probe card 5 is formed of a main board and a sub-board to be described later, and it is provided with a plurality of probe styli (contact terminals) 15 opposing a wafer 14, which serves as the inspection object placed on the wafer stage 6. The plurality of probe styli 15 are electrically connected to the contract ring 4 through a predetermined circuit included in the probe card 5. The wafer 14 is segmented on its principal surface into a plurality of chip regions, and a semiconductor integrated circuit and a plurality of pads (first electrodes (not illustrated)) that are electrically connected to such semiconductor integrated circuit are formed in each chip region. When the plurality of probe styli 15 are brought into contact with these pads, the tester 1, test head 2, performance board 3, contact ring 4, probe card 5 and semiconductor integrated circuit formed within the wafer 14 are connected electrically, and a probe inspection can be carried out by sending an inspection signal to the semiconductor integrated circuit.

Figure 3:
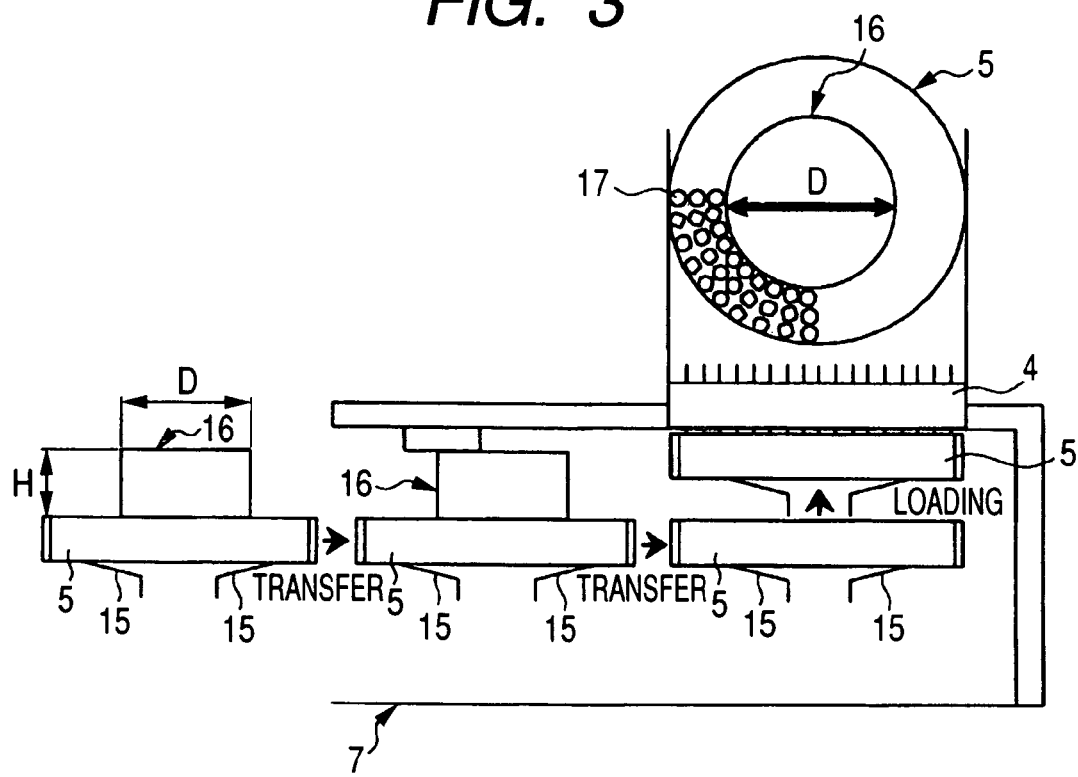
FIG. 3 is a diagram illustrating procedures for mounting the probe card illustrated in FIG. 1 into a prober.

FIG. 3 is a diagram illustrating the procedures up to the loading of the probe card 5 to the contact ring 4 through transfer into the prober 7. Over the probe card 5, electronic components are mounted to form a circuit for electrically connecting a plurality of probe styli 15, and the contact ring 4 and a region 16 having a circular flat plane for allocating the wires are provided. In profile of the embodiment, this region 16 is specified to have a diameter D and height H. The diameter D is specified so that the pogo-pins (connecting means) which extend from the contact ring 4 are allocated at the internal side of the arrangement of the connect pad 17 to be connected within the plane. The height H is specified as a size which is sufficient for the probe card 5 to enable automatic transfer thereof up to the loading position of the contact ring 4 when it is transferred into the prober 7, without causing the electronic components and wires allocated within the region 16 to collide with the members forming the prober 7.

Figure 4:
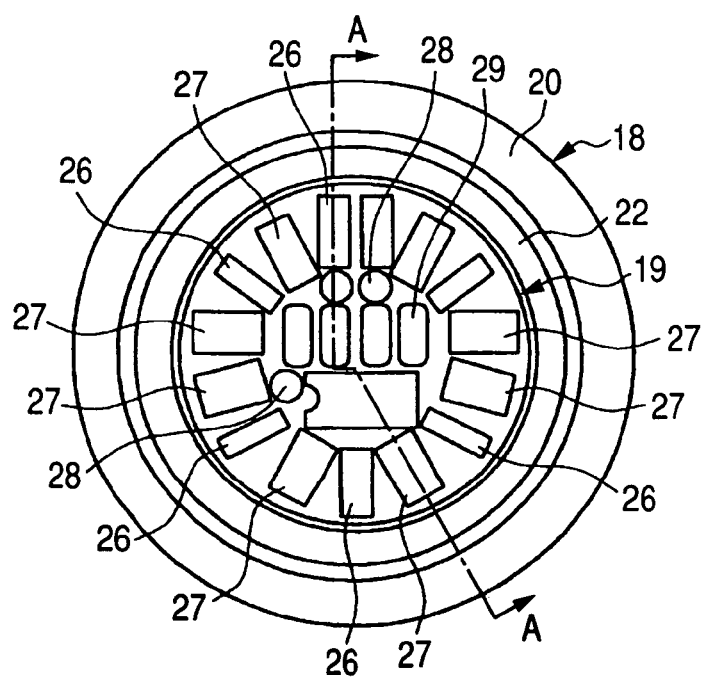
FIG. 4 is a plan view of the probe card illustrated in FIG. 1.
Figure 5:
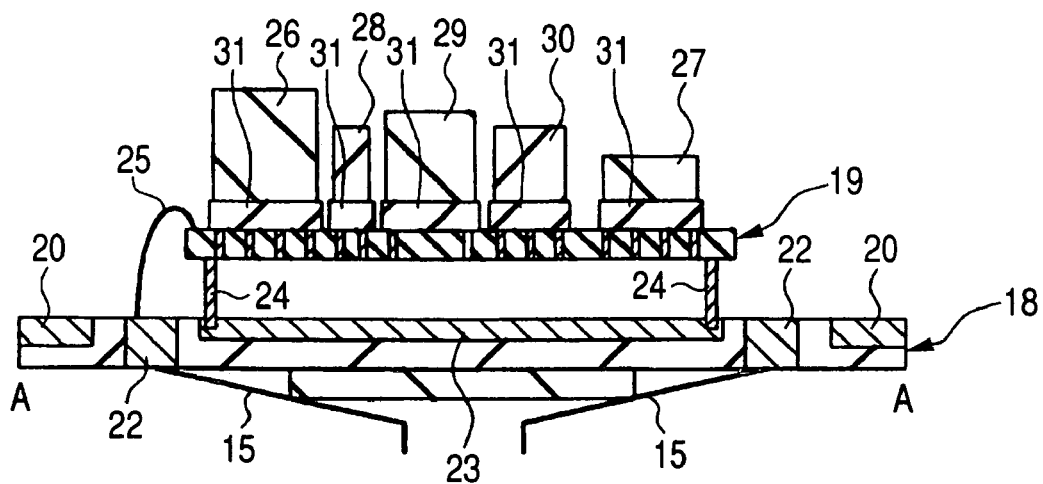
FIG. 5 is a cross-sectional view of FIG. 4 taken along the line A-A.

As illustrated in FIG. 4 and FIG. 5, the probe card 5 is formed of a main board (first board) 18 and a sub-board (second board) 19, which is arranged on the principal surface of the main board 18. FIG. 4 is a plan view of the probe card 5, while FIG. 5 is a cross-sectional view taken along the line A-A in FIG. 4.

Figure 6:
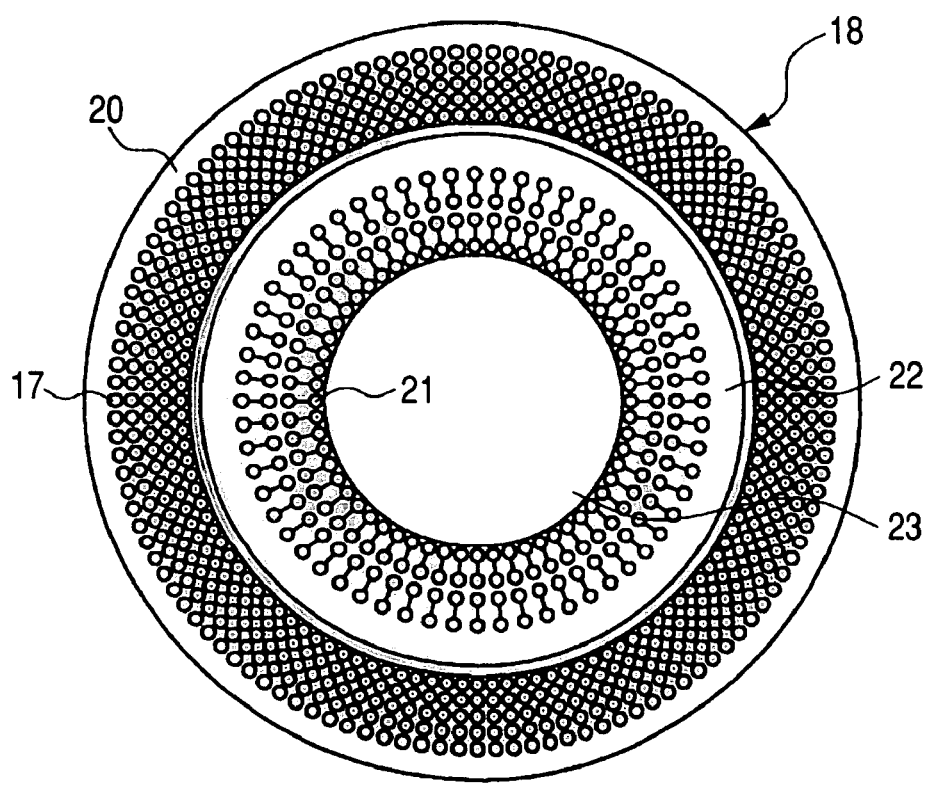
FIG. 6 is a plan view illustrating the principal surface of the main board illustrated in FIG. 4.

Moreover, as illustrated in FIG. 6, in addition to FIG. 4 and FIG. 5, an external circumferential pad region (five region) 20 where the connect pad 17 is located from the external circumference, an internal circumferential pad region (fourth region) 22, where a pad 21 is located for electrical connection with the probe stylus mounted at the rear surface of the main board 18, and a ground potential region (third region) 23, which is electrically connected to the ground potential, are provided over the principal surface of the main board 18. FIG. 6 is a plan view illustrating the principal surface of the main board 18. The connect pad 17 and pad 21 are connected at predetermined ones of the pads with each other through wires provided within the main board 18.

The sub-board 19 is located inside of the internal circumferential pad region 22 and is supported from the rear surface thereof by a plurality of metal poles 24 that are connected to the ground potential region 23. The poles 24 are electrically connected with the wires that are at ground potential among the wires formed over the upper surface, lower surface, and within the inside of the sub-board 19. The predetermined pads, among the pads 21 provided on the main board 18, are electrically connected with the pads (not illustrated in FIG. 4 and FIG. 5) located over the upper surface of the sub-board 19 via a jumper wire (first wire) 25.

In this embodiment, the circuit for inspection (first circuit), such as OSC circuit, X'tal circuit, bypass circuit, or AD/DA, circuit is provided over the sub-board 19. The circuit for inspection is formed of electronic components, such as relays 26, 27, a capacitor 28, a crystal-controlled oscillator 29, and an IC 30 that are fixed on the upper surface (principal surface) of the sub-board 19. In this embodiment, these electronic components should be selected to be as small as possible in external size, particularly in height, among the components satisfying the necessary characteristics required for formation of the circuit for inspection.

Over the sub-board 19, a plurality of sockets 31 are fixed for electrical connection with the predetermined wires formed over the upper surface (principal surface), lower surface, and internal side of the sub-board 19. Electronic components are loaded into the corresponding sockets 31, and they also can be loaded onto the sub-board 19 through contact between the terminals (first terminals) of the sockets 31 and the lead terminals (second terminals) of the electronic components. By introducing the structure where a electronic components are loaded onto the sub-board 19 using the sockets 31, replacement with new electronic components may be realized easily should failures occur in the electronic components.

The relays 26, 27 are located on a line along the external circumference of the upper surface of the sub-board 19. Moreover, as described above, the relays, which are as small as possible in external size, are selected as the relays 26, 27 from those satisfying the characteristics required to form the circuit for inspection. Therefore, since a crowded arrangement of relays 26, 27 can be avoided, the heat generated from the relays 26, 27 can be released easily. Moreover, since the sub-board 19 is supported with the poles 24 over the main board 18, the heat generated by the relays 26, 27 can be released through the space provided under the sub-board 19. Since the heat generated by the relays 26, 27 can be released easily, the relays 26, 27 can be operated under the temperature required for operation (for example, about 20° C. to 60° C.). That is, defective operations of relays 26, 27 due to a temperature rise can be prevented. In addition, since the thermal load applied to the electronic components, including the relays 26, 27, can be lowered by releasing the heat generated from the relays 26, 27, the expected life-span in operation of these electronic components can be extended.

The jumper wire 25 is connected to the pads located in a region inside of the region where the relays 26, 27 are located in the upper surface of sub-board 19. Moreover, the pads over the upper surface of the sub-board 19 that are connected to the jumper wire 25 are selected, as much as possible, from those located nearer to the pads 21 that are connected to the jumper wire 25. Therefore, the length of jumper wire 25 can be set to be as short as possible. As a result, it is possible to prevent noise, for example, resulting from reflection or the like from being mixed into the signals transmitted via the jumper wire 25. Moreover, as described above, since the sub-board 19 is located inside of the internal circumferential pad region 22, the jumper wire 25 can be loaded easier.

When the circuit for inspection is provided over the upper member of the probe card 5, for example, over the performance board 3, generation of the following problems is assumed, because of the improvement in the packing density of the semiconductor integrated circuit formed over the wafer 14 and the operation rate of the circuits. That is, when the signal sent, for example, from the test head 2 flows near a clock generator, such as an OSC circuit and X'tal circuit, noise resulting from crosstalk is generated, impeding generation of a normal clock (signal waveform). As to the semiconductor integrated circuit which serves as the inspection object and which has received a signal including noise, there is a concern that defective operation may occur, resulting in the problem that accurate probe inspection becomes impossible. For this reason, it is preferable that the circuit for inspection be provided at a position as near as possible to the wafer 14 of the inspection object, namely, at the probe card 5.

Figure 7:
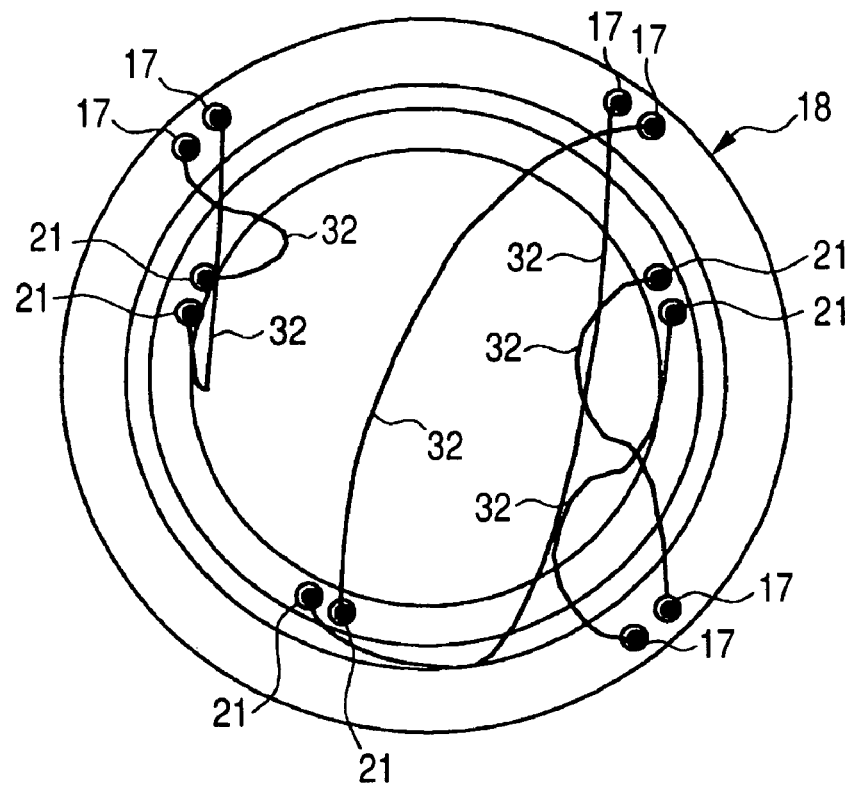
FIG. 7 is a plan view showing the inside structure of the main board illustrated in FIG. 4.
Figure 8:
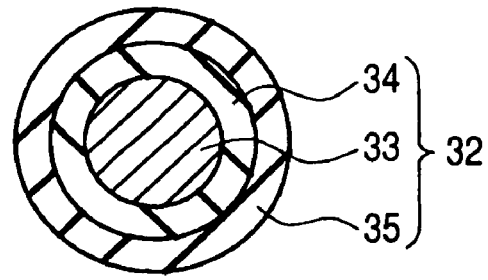
FIG. 8 is a cross-sectional view of wires illustrated in FIG. 7.
Figure 9:
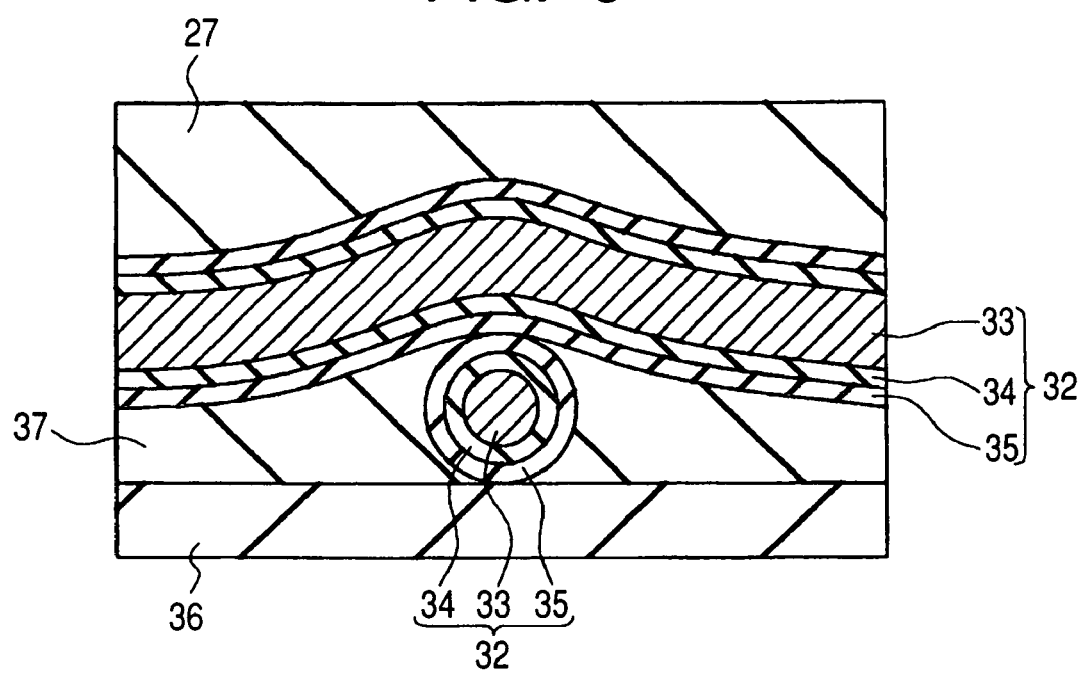
FIG. 9 is a cross-sectional view of a representative portion of the region where wires are crossing within the main board illustrated in FIG. 4.

FIG. 7 is a plan view illustrating an example of the internal structure of the main board 18. FIG. 8 is a cross-sectional view of the wires located within the main board 18. FIG. 9 is a cross-sectional view showing a region where the wires illustrated in FIG. 8 cross inside of the main board 18.

As illustrated in FIG. 7, predetermined ones of the connect pads 17 and the pads 21 are electrically connected through wires (fifth wires) 32 that are embedded within the main board 18. As illustrated in FIG. 8, in the case of wire 32, a copper wire 33 having a uniform diameter is covered for insulation purposes with a polyimide resin film 34, and, moreover, the circumference of polyimide resin film is coated with a bonding agent 35. The main board 18 in which such a wire 32 is embedded can be formed through processes in which a plurality of wires 32 are laid in a predetermined pattern over a base material (refer to FIG. 9) formed of glass-cloth-epoxy resin or polyimide using a computer-controlled wiring machine, and, thereafter, the base material 36 over which a plurality of wires 32 are laid is covered with a pre-preg 37 formed, for example, of a glass-cloth-epoxy resin. On the occasion of electrically connecting the predetermined connect pad 17 and pad 21 using such wires 32, a plurality of wires 32 may be crossed freely within the main board 18. Therefore, the length of the wires 32 can be reduced. Accordingly, noise resulting from crosstalk and reflection can no longer be generated easily on the wires 32. In addition, since the copper wire 33 has a uniform diameter and provides a stable characteristic impedance, the wires 32 can easily realize a matching of theoretical values of the electrical characteristic and actually measured values, and they are also capable of transferring accurate inspection signals. Moreover, since a plurality of wires 32 can be crossed freely within the main board 18, the wires may be laid at an equal length considering the periods of the signals they carry. As a result, when the probe card 5 in this embodiment simultaneously transmits inspection signals to a plurality of chip regions that are formed over the wafer 14 which serves as the inspection object, the difference in the times of arrival of the inspection signals between the chip regions can be reduced. Accordingly, a determination that a chip is no-good (defective) based on a delay in the arrival of the inspection signal can be prevented.

Figure 10:
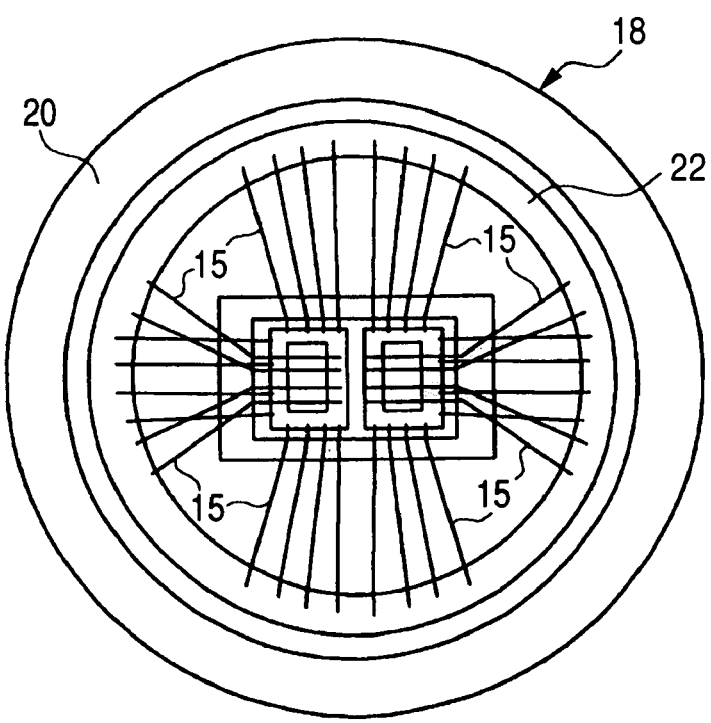
FIG. 10 is a plan view showing the lower surface of the main board illustrated in FIG. 4.

FIG. 10 is a plan view showing the lower surface of the main board 18. As illustrated in FIG. 10, the probe card 5 in this embodiment carries out probe inspection by, for example, simultaneously a plurality of probe styli 15 into contact with two chip regions. Each probe stylus 15 is led from the internal circumferential pad region 22 for electrical connection with the pad 21 (refer to FIG. 6 and FIG. 7), as described above. Moreover, the end point of each probe stylus 15 is located so as to be opposed to the pad formed in the corresponding chip region at the time of probe inspection.

Figure 11:
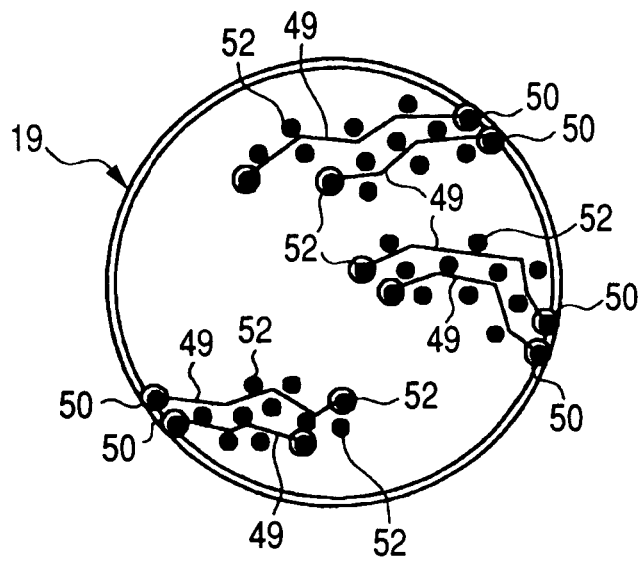
FIG. 11 is a plan view illustrating the upper surface of the sub-board illustrated in FIG. 4.
Figure 12:
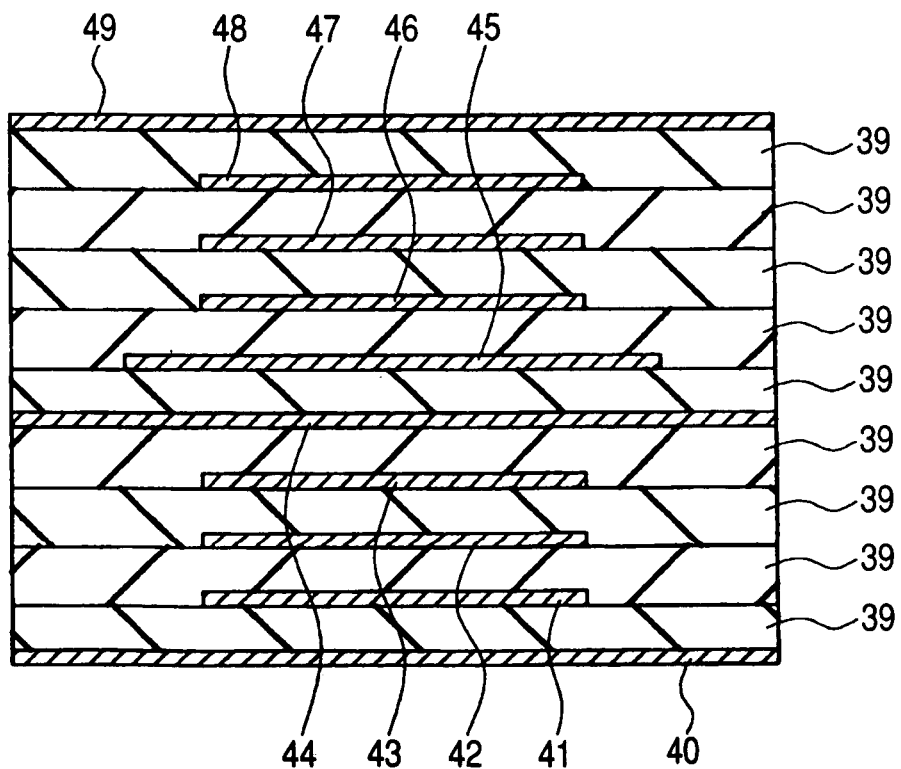
FIG. 12 is a cross-sectional view of a representative portion of the sub-board illustrated in FIG. 11.

FIG. 11 is a plan view showing the upper surface of the sub-board 19. Moreover, FIG. 12 is a cross-sectional view of a portion of the sub-board 19.

The sub-board 19 in this embodiment is a built-up circuit board which has been formed by alternately stacking an insulating layer 39 and circuit boards 40 to 49. Over the upper surface of the sub-board 19, the pad 50 is location in a region (second region) outside of the region (first region) where the relays 26, 27 (not illustrated in FIG. 11) are located. Over the pad 50, a jumper wire 25 (not illustrated in FIG. 11) is connected. Over the upper surface of the sub-board 19, the pads 50 and the pad 51, located in a region inside of the region where the pads 50 are located, are electrically connected between corresponding ones of the pads via the wiring layer 49, which is provided as the uppermost layer. Moreover, via-holes 52 are provided within the sub-board 19, and the wiring layers are electrically connected, and the pads 50, 51 are also connected electrically, to the wiring layers 40 to 49 through the conductive materials filling the via-holes 52. In addition, in this embodiment, a wiring layer 44 is electrically connected with the poles 24 (refer to FIG. 5) and the ground potential region 23 so that it is set to the ground potential, while a wiring layer 45 is used to supply the power supply voltage to the relays 26, 27; and, the wiring layers 41 to 43 and wiring layers 46 to 48 are used to transfer the inspection signals, while the wiring layers 40, 49 are used for electrical connection of pads at the upper and lower surfaces of the sub-board 19.

In this embodiment, the wiring layer 49 of the uppermost layer, which is formed over the surface of the sub-board 19, is formed previously between the corresponding pads 50 and pads 51, and an unwanted wiring layer (fourth wire) 49 selects the pads 51 that are electrically connected to the pads 50, the wiring layer and the probe stylus 15 by cutting thereof, for example, using a cutter. Accordingly, one kind of sub-board 19 may be used for the probe inspections of a plurality of kinds of semiconductor integrated circuits.

Since the wires (wiring layers) forming the circuits, including the circuits for inspection, such as an OSC circuit, a X'tal circuit, a bypass circuit, and an AD/DA circuit, can be isolated by as much as a predetermined distance (first distance) by forming various circuits, including the inspection circuits, using the sub-board 19 to which the wiring layers 40 to 49 are formed, the generation of noise resulting from crosstalk and reflection due to the crowded arrangement of wires (wiring layers) can be prevented. In addition, the location of the wiring layer 44 that is connected to the ground potential between the wiring layers makes the generation of noise difficult.

Figure 13:
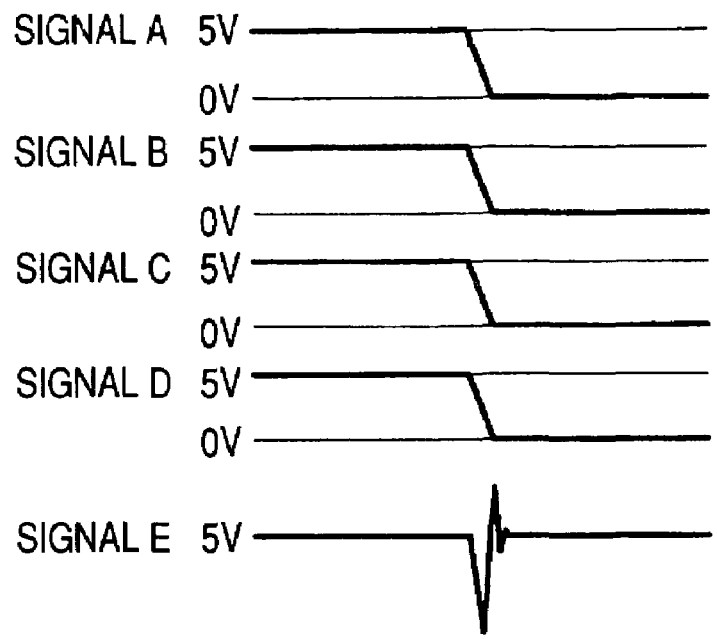
FIG. 13 is a signal diagram illustrating noise generating areas resulting from crosstalk.
Figure 14:
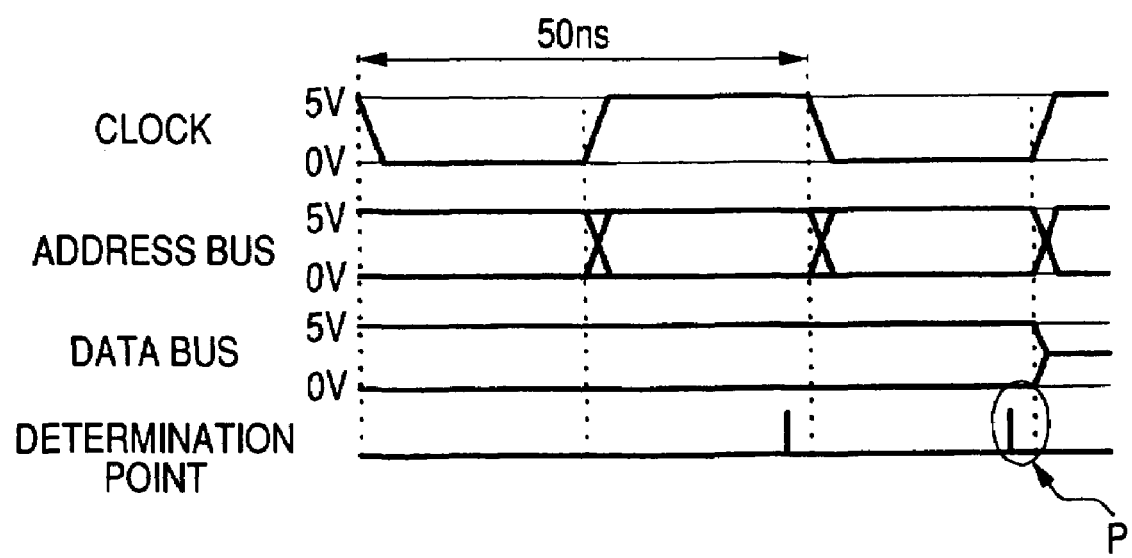
FIG. 14 is a signal diagram illustrating noise generating areas resulting from crosstalk and reflection.
Figure 15:
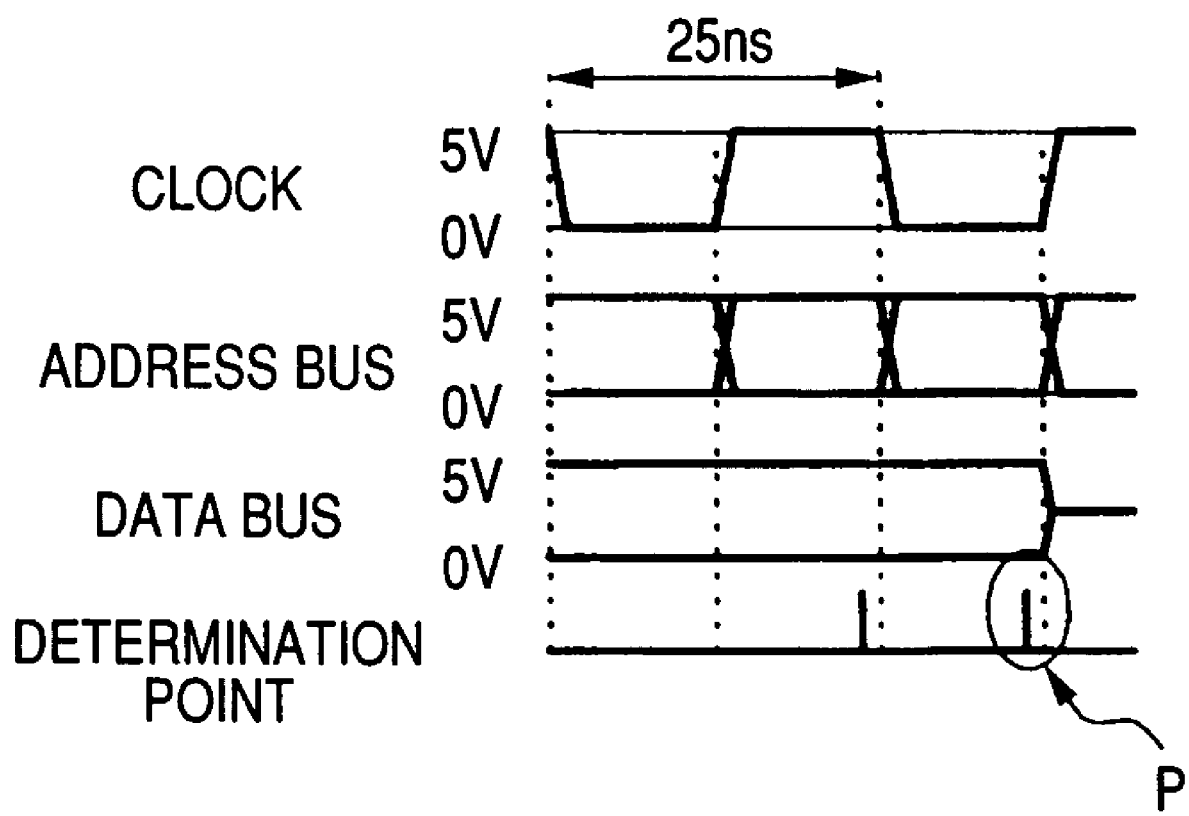
FIG. 15 is a signal diagram illustrating noise generating areas resulting from crosstalk and reflection.

Meanwhile, in the case where the probe card 5 is formed without use of the sub-board 19 in this embodiment, the electronic components, such as relays 26, 27, capacitor 28, crystal-controlled oscillator 29 and IC 30 (refer to FIG. 4 and FIG. 5), are mounted over the upper surface of the main board 18, and the wires to form various circuits through connection with these electronic components are allocated over the main board 18. Therefore, the wires are crowded and extend in parallel, resulting in the problem that noise based on crosstalk and reflection is likely to occur in the wires. FIG. 13 is a diagram illustrating the areas where noise is generated resulting from crosstalk, while FIG. 14 and FIG. 15 are diagrams illustrating the areas of noise resulting from crosstalk and reflection is generated. When the wires are crowded and extend in parallel, noise is generated in the data bus (signal E), which is maintained at the High level, when any of the address buses (signals A to D) changes to the Low level (0V) from the High level (5V), as illustrated in FIGS. 13 to 15. This noise is called crosstalk noise. If noise resulting from crosstalk is generated, a problem occurs in that the accuracy of probe inspection is likely to be lowered. Moreover, when the frequency of the inspection signal becomes high, for example, when the clock rises to 40 MHz (period: 25 ns) from 20 MHz (period: 50 ns), as illustrated in FIG. 14 and FIG. 15, the interval between the determination points is narrowed to a half. The data bus changes immediately after the position indicated by P among the determination points. However, since noise due to reflection is easily generated immediately before this change, the allowance of the measurement timing is lost at the position indicated by P, resulting in the problem that the accuracy of the probe inspection is likely to be lowered.

Figure 16:
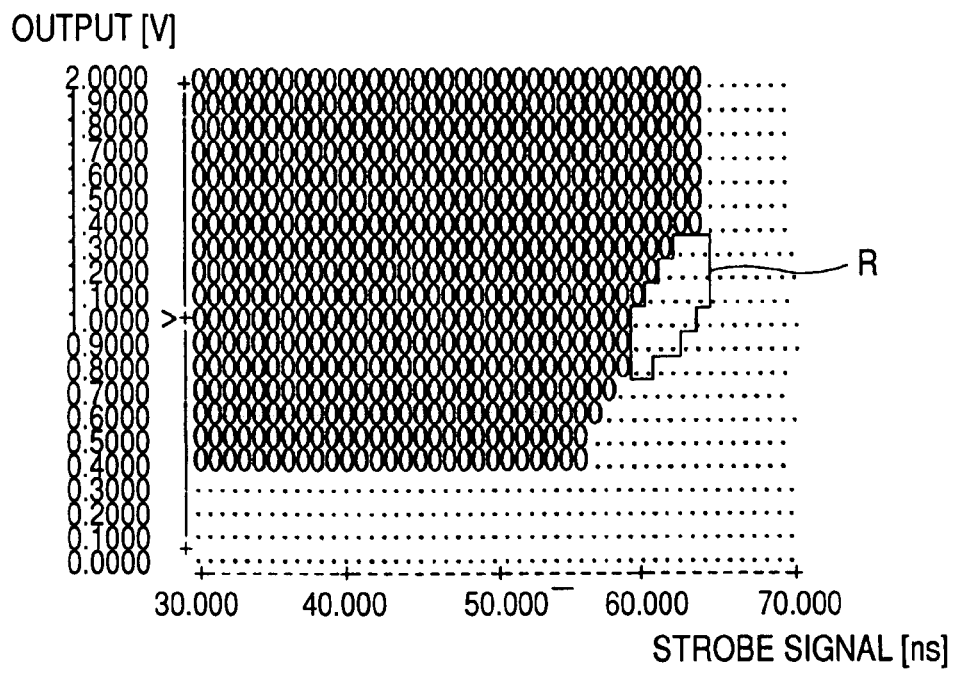
FIG. 16 is a diagram illustrating noise generating areas resulting from reflection.
Figure 17:
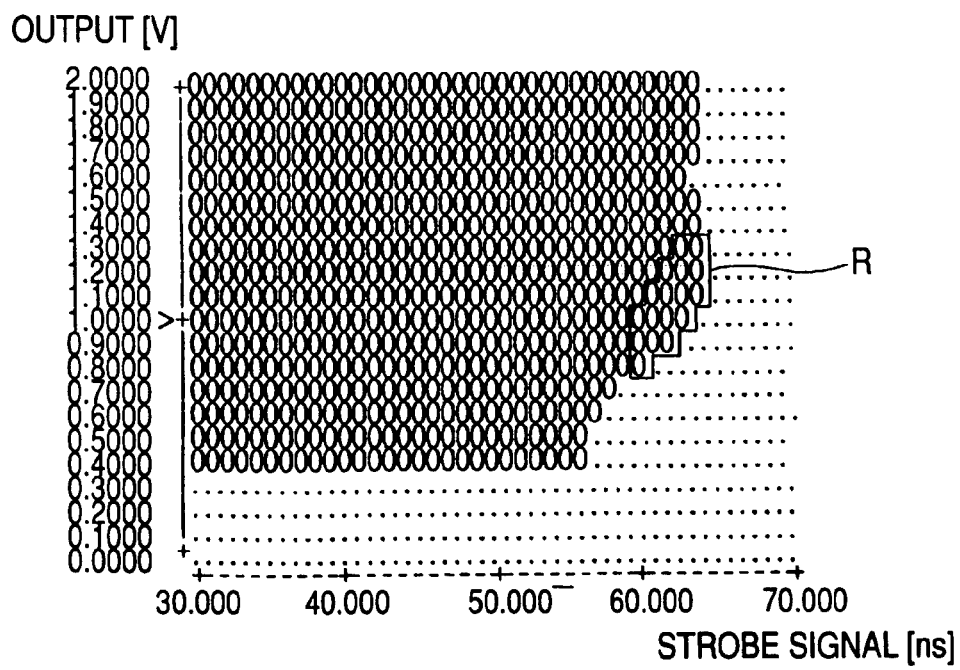
FIG. 17 is a diagram illustrating noise generating areas resulting from reflection.

FIG. 16 and FIG. 17 are diagrams showing the positions where noise resulting from reflection are generated. FIG. 16 indicates the result of probe inspection using the probe card 5 formed without use of the sub-board 19 of this embodiment, while FIG. 17 indicates the result of probe inspection using the probe card 5 of the present embodiment. As illustrated in FIG. 16 and FIG. 17, when probe inspection is carried out using a probe card 5 that is formed without the use of the sub-board 19, the data of the part indicated by R cannot be obtained. This condition occurs due to the influence of noise resulting from reflection. Moreover, since the region where electronic components and wires may be allocated is restricted to the area over the main board 18, if the semiconductor integrated circuit device which serves as the object of probe inspection is diversified in function, the number of wires increases, the wires are more crowded, and, thereby, noise may be generated easily on the wires. Namely, a problem occurs in that the probe card 5 cannot be available for diversification of functions of the semiconductor integrated circuit device which serves as the object of probe inspection.

On the other hand, according to this embodiment, since the jumper wire 25 for electrically connecting the main board 18 and sub-board 19 and the wire 32 embedded in the main board 18 can be set as short as possible and the interval between the wiring layers 40 to 49 included in the sub-board 19 can be isolated by a predetermined distance as described above, the generation of noise resulting from crosstalk and reflection on the wires can be prevented. In addition, since various circuits may be formed with the wiring layers 40 to 49 formed within and over the surface of the sub-board 19, the number of wires allocated in the probe card 5 can be reduced remarkably and a crowded arrangement of wires can be prevented. Accordingly, the generation of noise on the wires resulting from crosstalk and reflection also can be prevented. Namely, even when the semiconductor integrated circuit device which serves as the object of probe inspection is diversified in the functions thereof, such functions may be realized without an increase in the number of wires. Moreover, according to this embodiment, since generation of noise on the wires resulting from reflection can be prevented, a lowering of the accuracy of the probe inspection also can be prevented, even when the frequency of the inspection signal becomes high.

In addition, when the probe card is formed without use of the sub-board 19 of this embodiment, since the region where the electronic components and wires can be located is restricted over the main board 18, such electronic components and wires are crowded in arrangement. Moreover, since the electronic components and wires must be arranged within a restricted region, the electronic components and wires which cannot be located within the restricted region are provided through stacking in the upward direction. Therefore, the heat generated from the electronic components and wires cannot easily be released and dissipated, and a problem occurs in that defective operation is likely to occur because the temperature of the electronic components, particularly of the relays, rises. In addition, since the heat generated from the electronic components and wires cannot be released easily, a problem occurs in that the expected operation life of the electronic components is likely to be reduced. Moreover, since the electronic components and wires are stacked in the upper direction and thereby height of the probe card 5 becomes high, a problem occurs in that automatic transfer of the probe card 5 into the prober 7, automatic transfer thereof to the external side of the prober 7, and automatic loading/unloading of the probe card 5 to/from the contact ring 4 are likely to be disabled. Meanwhile, according to this embodiment, the number of wires allocated over the probe card 5 can be reduced remarkably, and the relays 26, 27 (refer to FIG. 4) are arranged on a line along the external circumference of the upper surface of the sub-board 19 by forming various circuits with the wiring layers 40 to 49 formed within and over the surface of the sub-board 19, as described above. Therefore, since a crowded arrangement of electronic components and wires may be avoided, the heat generated from the electronic components and wires can be released easily. In addition, since the sub-board 19 is supported over the main board 18 using the poles 24, the heat generated from the electronic components and wires can be released from the space under the sub-board 19. Accordingly, a defective operation of electronic components can be prevented, and a long operation life can be realized. Furthermore, since electronic components which are small in external size, particularly in the height thereof, are selected from those satisfying the characteristics required to form the inspection circuit, an increase in height of the probe card 5 can be prevented. Therefore, automatic transfer of the probe card 5 into the prober 7, automatic transfer thereof to the external side of the prober 7, and automatic loading/unloading of the probe card 5 to/from the contact ring 4 can be realized.

Moreover, when the probe card 5 is formed without use of the sub-board 19 of this embodiment, a problem may occur, in which, since allocation of electronic components and wires are crowded over the main board 18, repair is likely to become difficult, if the electronic components and wires are displaced or disconnected from the main board 18 due to oxidation of the solder that is used for mounting the electronic components and wires over the main board 18. In addition, since the electronic components and wires are crowded in arrangement, when the electronic components are deposited using solder, a problem occurs in that replacement of components is likely to become difficult when a failure is generated in such electronic components. Furthermore, since the number of wires becomes large over the main board 18, a problem, in which wires are likely to be connected erroneously to the pads 21, and the probe card is likely to be delivered in a state where a disconnection of some wires is not detected. Meanwhile, since various circuits, including the inspection circuit, are formed of the wires 32 embedded in the main board 18 and the wiring layers 40 to 49 formed within and over the surface of the sub-board 19 in this embodiment, the number of wires located over the probe card 5 can be reduced to a large extent and a crowded arrangement of wires also can also be eliminated. Accordingly, even if electronic components and wires are displaced and disconnected from the probe card 5, repair may be carried out easily. In addition, in this embodiment, since the electronic components are mounted on the probe card 5 (sub-board 19) using sockets, if a failure occurs in such electronic components, the relevant electronic component can be replaced easily. In addition, according to this embodiment, since the number of wires allocated over the probe card 5 may be reduced remarkably, it is possible to prevent the possibility that wires are connected erroneously to the pads 21, and the probe card is delivered in a state where disconnection of some wires is not detected. Moreover, according to this embodiment, since the number of wires allocated over the probe card 5 can be reduced distinctively, the fabrication period in the manufacture of probe card 5 can be shortened. Namely, the delivery period of probe card 5 can be shortened. In addition, the fabrication cost of the probe card 5 of this embodiment can be lowered by remarkably reducing the number of wires allocated over the probe card 5.

FIG. 18 illustrates a difference in the yields of the second probe inspection and the third probe inspection when the probe inspection has been conducted three times for the same wafer 14 (refer to FIG. 1), showing the results attained when the probe card 5 of this embodiment is used (hereinafter, referred to as the condition A), and when the probe card 5 which has been formed without use of the sub-board 19 of this embodiment is used (hereinafter, referred to as the condition B). As illustrated in FIG. 18, an average value of the difference in the yields of the second probe inspection and the third probe inspection of the 2347 wafers 14 used as samples is about 2.69% under the condition B, while an average value of the 2494 wafers used as samples is about 1.48% under the condition A, showing an improvement of about 1.21%. Namely, the difference in these average values suggests that the yield of probe inspection can be improved using the probe card 5 of this embodiment.

FIG. 19 illustrates the rate of generation of chip regions which have been determined to be defective regions based on the noise (noise resulting from crosstalk or reflection) generated on the wires provided to the probe card 5 when the probe inspection has been conducted to a wafer 14 (refer to FIG. 1), showing the respective results under the conditions A and B. As illustrated in FIG. 19, an average value of the rate of generation of chip regions determined to be defective regions because of noise has been about 0.73% in the 2347 wafers 14 used as the samples under the condition B, while an average value in the case of the 2494 wafers used as the samples has been about 0.48% under the condition A, showing an improvement of about 0.25%. Namely, the difference in these average values suggests that noise generated on the wires provided in the probe card 5 can be reduced using the probe card 5 of this embodiment.

FIG. 20 and FIG. 21 illustrate the results of probe inspections conducted on a plurality of wafers on which a kind of semiconductor integrated circuit that is different from the circuit formed on the wafer 14, which serves as the object of probe inspection illustrated in FIG. 18 and FIG. 19, is formed, respectively showing the results under the conditions A and B. According to the results illustrated in FIG. 20, an average value of the yield of probe inspection in the 3281 wafers used as samples has been about 91.98% under the condition B, while an average value in the case of 1654 wafers used as the samples has been about 94.11% under the condition A, showing an improvement of about 2.13%. Moreover, according to the results illustrated in FIG. 21, an average value of the yield of probe inspection in the 4103 wafers used as samples has been about 91.26% under the condition B, while an average value in the case of the 4768 wafers used as the samples has been about 93.44% under the condition A, showing an improvement of about 2.51%. Namely, the difference in these average values suggests that the yield of probe inspection can be improved using the probe card 5 of this embodiment.

In the probe card 5 described above, as illustrated in FIG. 22, the probe stylus 15 (refer to FIG. 1) is located so as to make contact, by the single contact operation thereof, with two adjacent chip regions CHP for probe inspection provided along the operating direction (first direction) of the probe card 5. Moreover, FIG. 23 illustrates an arrangement of the chip regions CHP over the principal surface of the wafer 14 (refer to FIG. 1), which serves as the inspection object, an operating direction of the probe card 5, and a combination of two chip regions CHP to which the probe inspection is conducted simultaneously. With respect to a combination of two chip regions CHP, a combination indicated by the hatched areas, or the combination without any hatched areas, are indicated. With selection of chip regions CHPs as described above, when 232 chip regions CHP are segmented, for example, within the wafer 14, it is possible to realize a probe inspection for all chip regions CHPs through contacts, 116 times, of the probe stylus 15 with the wafer 14.

Figure 22:
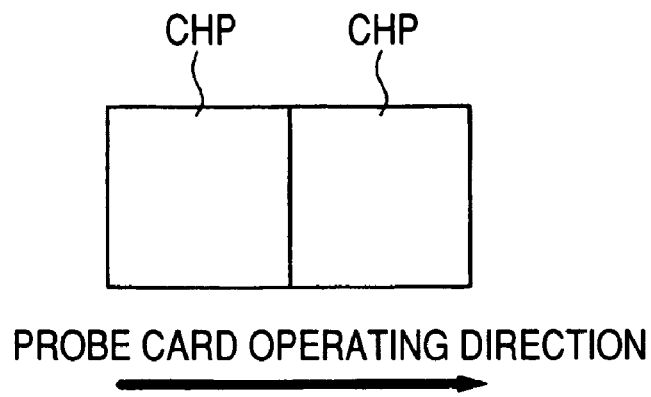
FIG. 22 is a plan view illustrating an arrangement of chip regions to which the probe inspection is implemented through single contact of a probe stylus.
Figure 23:
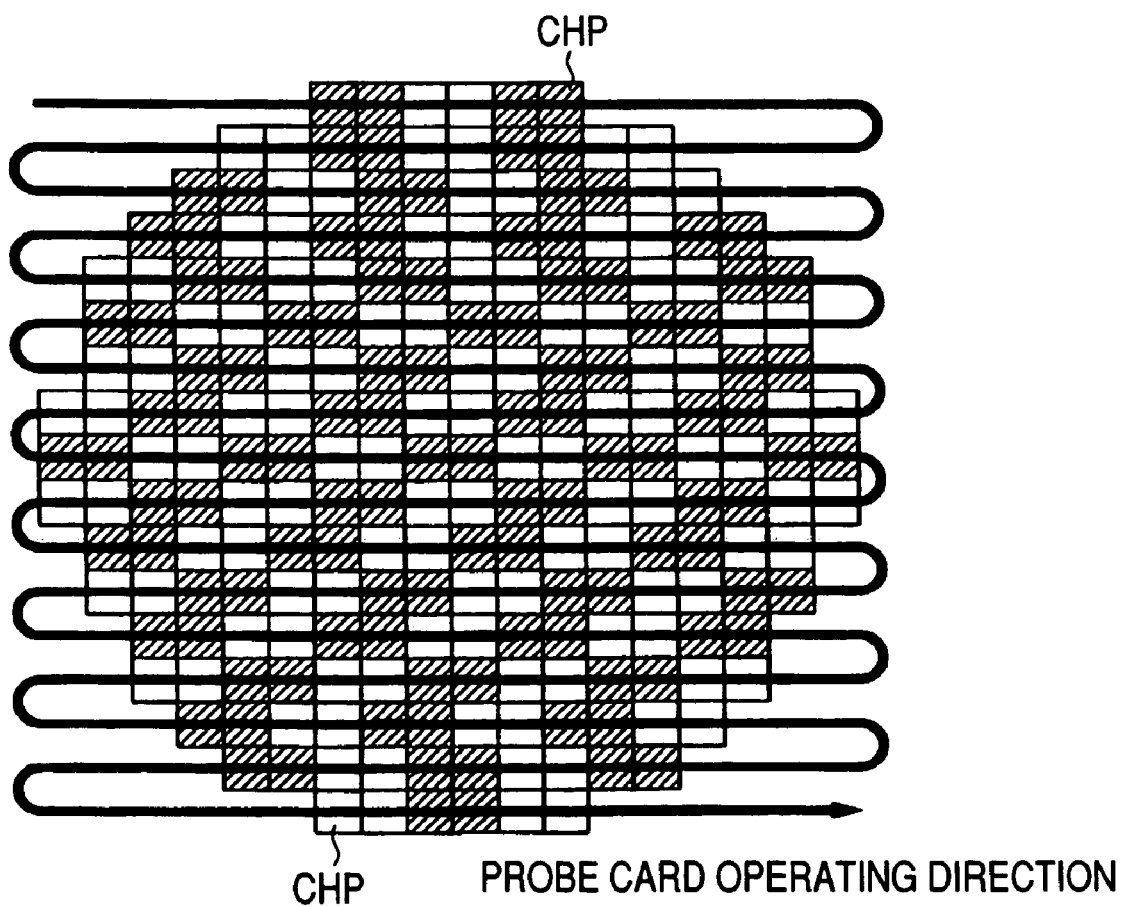
FIG. 23 is a plan view illustrating an arrangement of chip regions at the principal surface of a wafer serving as the inspection object, and a combination of two chip regions to which a probe inspection is implemented simultaneously.
Figure 24:
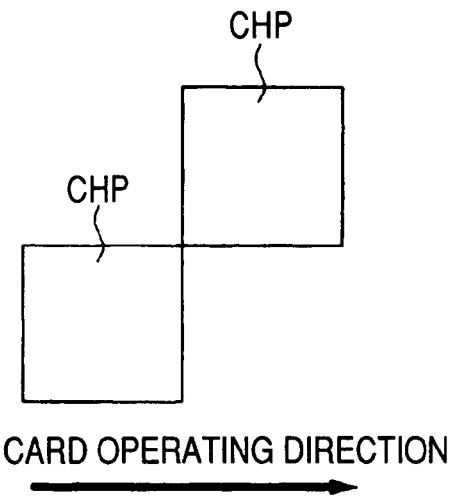
FIG. 24 is a plan view illustrating an arrangement of chip regions to which the probe inspection is implemented through single contact of the probe stylus.
Figure 25:
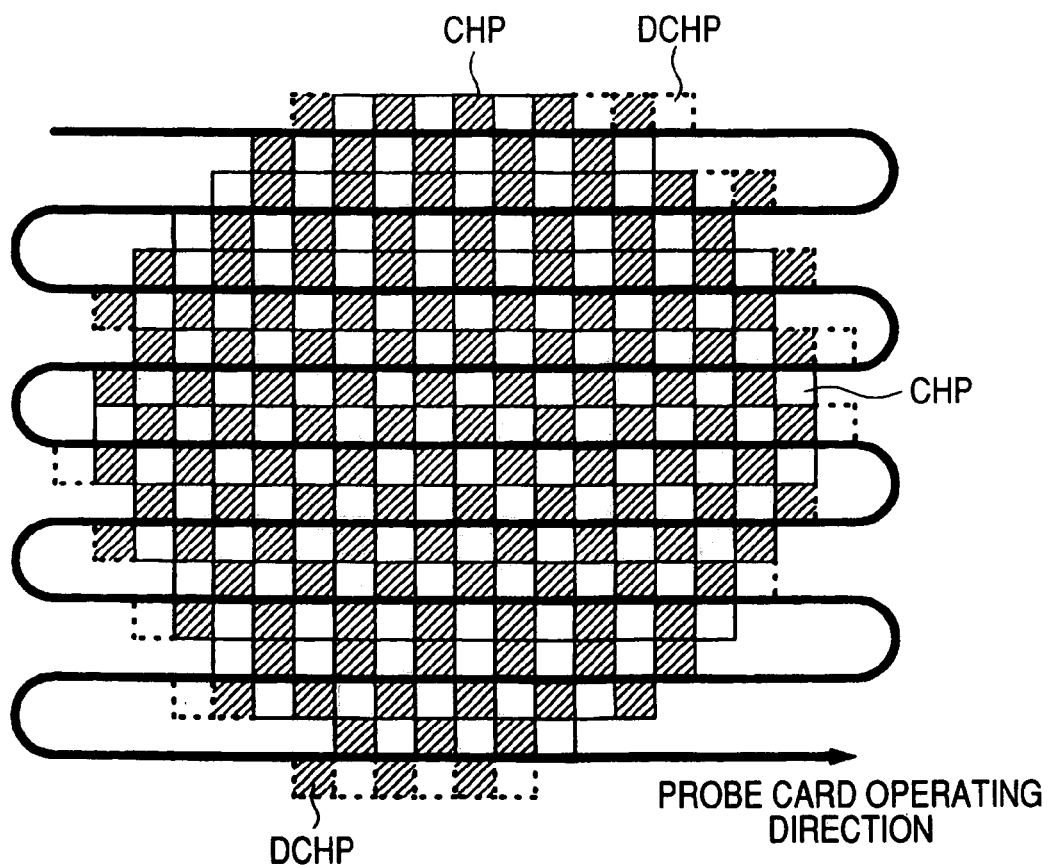
FIG. 25 is a plan view illustrating an arrangement of chip regions at the principal surface of a wafer serving as the inspection object, and a combination of two chip regions to which the probe inspection is implemented simultaneously.

Here, when the probe stylus 15 is capable of making contact with two adjacent chip regions CHP for probe inspection provided in the direction where a diagonal line is extended only with single contact operation thereof, as illustrated in FIG. 22, the arrangement of the chip regions CHP over the principal surface of the wafer 14, an operating direction of the probe card 5, and a combination of two chip regions CHP to which the probe inspection is conducted simultaneously are employed as illustrated in FIG. 25. Even in the case of FIG. 25, as the combination of two chip regions CHP, the combination indicated by the hatched areas, or the combination without any hatched area, can be introduced. When the chip regions CHPs are selected as described above, two chip regions CHP cannot be selected, and only one chip region CHP is selected in some cases. In this case, the probe inspection is conducted through combination with a dummy chip region DCHP, which does not exist actually. In FIG. 25, the dummy chip region DCHP is indicated with a dotted line. When the 232 chip regions CHP are segmented within the wafer 14, the probe inspection can be implemented to all chip regions CHP by bringing the probe stylus 15 in contact with the wafer 14 for 128 times. In this case, the number of times of contact of the probe stylus 15 with the wafer 14 is increased in comparison with that/of the embodiment indicated by FIG. 22 and FIG. 23. Namely, according to this embodiment, since the number of times of contact of the probe stylus 15 with the wafer 14 can be reduced, the time required for probe inspection can be shortened.

The present invention has been described practically on the basis of preferred embodiments of the present invention. However, the present invention is not limited thereto and allows various changes or modifications within a scope not departing from the subject matter thereof.

For example, in the previously described embodiment, the sub-board is allocated over the main board and the probe card is formed, but it is also possible for one or more substrates of the structure, which function similar to that of the sub-board, to be allocated over the sub-board using a means similar to that for allocating the one sub-board over the main board in forming the probe card.

Moreover, in the previously described embodiment, the sub-board is allocated over the main board and is supported with metal poles, and thereafter the probe card is formed, but it is also possible or the sub-board to be formed as an arc-shaped sub-board, with one or more sub-boards being allocated over the main board, so that a part corresponding to the string of the arc-shaped sub-board is brought into contact with the main board.

The method of fabrication of a semiconductor integrated circuit device in accordance with of the present invention can be widely adapted to the probe inspection of a semiconductor integrated circuit formed on a wafer.

What is claimed is:

1. A fabrication method of semiconductor integrated circuit device comprising the steps of:
    (a) preparing for a semiconductor wafer in which a plurality of chip regions are segmented, a semiconductor integrated circuit is formed over each region among a plurality of chip regions, and a plurality of first electrodes for electrical connection with said semiconductor integrated circuit are formed over a principal surface;
    (b) preparing for a first board provided with a plurality of contact terminals for contact with the first electrodes, a second board mounted over said first board to form a plurality of wiring layers for electrical connections with the contact terminals, and a probe card mounted over a principal surface of said second board, provided with a plurality of electronic components to form a first circuit for electrical connection with a tester, and connected electrically with said first and second boards through a plurality of first wires; and
    (c) conducting electrical inspection of said semiconductor integrated circuit by coming end points of the contact terminals into contact with the first electrodes,
        wherein the principal surface of said first board comprises:
        (i) a third region electrically connected to the ground potential;
        (ii) a fourth region which surrounds said third region and to which a plurality of third wires for electrically connecting said first board with second board are connected; and
        (iii) a fifth region which surrounds said fourth region and to which a connecting means for electrically connecting said probe card with said tester is connected; and
        wherein said second board is allocated within said third region in a plane.

2. The fabrication method of semiconductor integrated circuit according to claim 1,
    wherein the step (c) is executed by coming said end points of the contact terminals in contact with the first electrodes included in a plurality of first chip regions among a plurality of chip regions.

3. The fabrication method of semiconductor integrated circuit according to claim 2,
    wherein the first chip regions are said two chip regions and are allocated adjacently along a first direction in which said probe card operates in said step (c).

4. The fabrication method of semiconductor integrated circuit device according to claim 1,
    wherein fifth wires are formed as the wires embedded in said first board for electrical connections with the contact terminals,
    (i) wherein said fifth wires includes conductive layers and insulating layers, and
    (ii) wherein said conductive layers are covered with said insulating layers.

5. The fabrication method of semiconductor integrated circuit according to claim 1,
    wherein said wiring layers within said second board are allocated separately with an interval of a predetermined first distance.

6. The fabrication method of semiconductor integrated circuit device according to claim 1,
    wherein the electronic components include a plurality of relays, and
    wherein the relays are arranged in a line along the external circumference of said principal surface of said second board.

7. The fabrication method of semiconductor integrated circuit device according to claim 6,
    wherein the first wires are connected to the second regions in the external circumference of the first regions where the relays are allocated in said principal surface of said second board.

8. The fabrication method of semiconductor integrated circuit device according to claim 1,
    wherein a plurality of sockets which are connected electrically to said first circuit and to which said electrical components are loaded are positioned over said principal surface of said second board, and
    wherein the sockets are electrically connected with the electronic components by coming a first terminals of the sockets in contact with a second terminals of the electronic components.

9. The fabrication method of semiconductor integrated circuit device according to claim 1,
    wherein the wiring layers are formed over the principal surface of said second board and within said second board, and
    wherein said wiring layers or said wires for electrical connections of the electrical components are selected by cutting the predetermined fourth wires among a plurality of wires included in said wiring layer of said principal surface of said second board.

* * * * *